(12) United States Patent
Nagai

(10) Patent No.: US 6,396,152 B2
(45) Date of Patent: May 28, 2002

(54) SEMICONDUCTOR DEVICE AND PRODUCTION METHOD THEREOF

(75) Inventor: Yukihiro Nagai, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/765,638

(22) Filed: Jan. 22, 2001

(30) Foreign Application Priority Data

Jul. 17, 2000 (JP) .................................... 2000-215400

(51) Int. Cl.[7] ............................................. H01L 29/40
(52) U.S. Cl. ............................................ 257/774; 257/67
(58) Field of Search .......................... 437/586, 52, 41; 438/586; 257/67, 347

(56) References Cited

U.S. PATENT DOCUMENTS

| | | | | |
|---|---|---|---|---|
| 5,100,817 A | * | 3/1992 | Cederbaum | 437/41 |
| 5,616,934 A | * | 4/1997 | Dennison et al. | 257/67 |
| 6,207,543 B1 | * | 3/2001 | Harvey et al. | 438/586 |

FOREIGN PATENT DOCUMENTS

| JP | 5-198684 | 8/1993 |
|---|---|---|
| JP | 11-214507 | 8/1999 |

* cited by examiner

Primary Examiner—David Nelms
Assistant Examiner—Thinh T Nguyen
(74) Attorney, Agent, or Firm—McDermott, Will & Emery

(57) ABSTRACT

A semiconductor device includes a semiconductor substrate, a lower interlayer film formed on an upper side thereof, an intermediate film formed on an upper side thereof, an upper interlayer film formed on an upper side thereof, and a lower plug made of an electrically conductive material that penetrates through the lower interlayer film and the intermediate film. However, the intermediate film has such a material quality that a ratio of an etching rate of the intermediate film to an etching rate of the upper interlayer film is sufficiently small to allow processing of the upper contact hole by etching the upper interlayer film using the intermediate film as a stopper under an etching condition for forming the upper contact hole.

10 Claims, 10 Drawing Sheets

SEMICONDUCTOR DEVICE AND PRODUCTION METHOD THEREOF

BACKGROUND OF THE INVENTION

1. Field of the Invention

The present invention relates to a semiconductor device including a plug contact. Here, a "plug contact" in this case refers to a state in which an electrical conductor is buried in the inside of a hole or a groove that communicates between an upper portion to be connected and a lower portion to be connected, which portions are spaced apart in an up-and-down direction in a layer structure, so as to establish an electrical connection between the two portions.

Here, the term "upper" refers to the side to which the principal surface of the substrate is oriented, and the term "lower" refers to its opposite side.

2. Description of the Background Art

In a conventional art, in using a plug contact for connection in the up-and-down direction, a hole (hereafter referred to as "upper contact hole") for providing contact from an upper side to a plug contact located on a lower side (hereafter referred to as "lower plug") is dug downwards to form an opening. This opening is often represented as "dropping a contact hole" or "dropping a contact".

If the upper contact hole is dropped to a place out of the lower plug due to pattern deviation or dimension errors, the contact made of an electrical conductor formed in the upper contact hole reaches a lower layer that is not originally intended. If the lower layer is an electrical conductor or the like, a short circuit is generated against the will of the designer, thereby raising a problem.

For this reason, the lower plug on which the upper contact hole is to be dropped is made to have a large diameter while the upper contact hole is made to have a small diameter so that the upper contact hole will always fall on the upper surface of the lower plug even if the position of the upper contact hole is deviated to the maximum.

Referring to FIGS. 10 to 19, a method of producing a semiconductor device according to a prior art technique will be described.

Referring to FIG. 11, an isolation oxide film 2 is formed on a semiconductor substrate 1 made of silicon shown in FIG. 10. Referring to FIG. 12, a transistor 3 is formed. Referring to FIG. 13, a stopper film 4 is formed. Referring to FIG. 14, a portion of the stopper film 4 is left as a side wall 5 on both sides of the transistor 3, and the other portions of the stopper film 4 are removed.

Referring to FIG. 15, a lower interlayer film 6 is formed so as to cover the semiconductor substrate 1, the isolation oxide film 2, and the transistor 3 from the upper side thereof.

A combination of the material qualities of the stopper film 4 and the lower interlayer film 6 is such that the ratio of the etching rate (i.e. selection ratio) of the lower interlayer film 6 to the etching rate of the stopper film 4 is sufficiently large under an etching condition for removing the lower interlayer film 6. Hereafter, the "selection ratio of A to B", for example, refers to a value which is obtained by dividing the etching rate of A with the etching rate of B. In order to remove A by etching using B as a stopper, it is desired that the "selection ratio of A to B" is large.

As the material quality of the stopper 4, SiON, densely formed $SiO_2$, and others may be mentioned as examples. As the material quality of the lower interlayer film 6, phosphorus-containing $SiO_2$, coarsely formed $SiO_2$, and others may be mentioned as examples. As the phosphorus-containing $SiO_2$, BPTEOS (Boro Phospho Tetra Ethyl Ortho Silicate), PSG (Phospho Silicate Glass), and others may be mentioned as examples. Further, in order to make a coarse $SiO_2$, PETEOS (Plasma Enhanced Tetra Ethyl Ortho Silicate) may be formed, for example.

Referring to FIG. 16, a lower contact hole 7 is opened which is a hole for forming a lower plug. In the etching process for forming this opening, the side wall 5 functions as a stopper film to protect the transistor 3. The semiconductor substrate 1 is exposed on the bottom surface of the lower contact hole 7. After a polycrystal silicon layer is formed on the entire surface from the upper side by thermal CVD (Chemical Vapor Deposition) or the like, unnecessary portions of the polycrystal silicon are removed by CMP (Chemical Mechanical Polishing) or the like so that the polycrystal silicon will remain only in the inside of the lower contact hole 7. Thus, a structure is obtained in which the inside of the lower contact hole 7 is filled with the electrically conductive polycrystal silicon, as shown in FIG. 17, and this polycrystal silicon part forms the lower plug 8. Referring to FIG. 18, an upper interlayer film 9 is formed on the upper side so as to cover the lower interlayer film 6 and the lower plug 8. As the material quality of the upper interlayer film 9, a general insulating film can be used; however, in particular, $SiO_2$, BPTEOS, P-TEOS, SiON, and others may be mentioned as examples.

Referring to FIG. 19, an upper contact hole 10 is formed by digging the upper interlayer film 9 downwards to penetrate therethrough by etching. The lower plug 8 has a larger diameter than the upper contact hole 10, and is disposed so that the lower plug 8 can receive the upper contact hole 10 even if the position of dropping the upper contact hole 10 is deviated to some extent.

As described above, in the prior art, in order to prevent short circuits, the lower plug is formed to have a large diameter while the upper contact hole is formed to have a small diameter. However, this raises a problem that, by forming the upper contact hole to have a small diameter, the contact resistance increases. Furthermore, it raises a problem that, by forming the lower plug to have a large diameter, the size of the semiconductor device increases.

Therefore, an object of the present invention is to provide a semiconductor device and a production method thereof in which the upper contact hole can be formed to have a larger diameter without the need for enlarging the lower plug.

SUMMARY OF THE INVENTION

In order to achieve the above-mentioned object, a semiconductor device according to the present invention includes a semiconductor substrate, a lower interlayer film formed on an upper side of the semiconductor substrate, an intermediate film formed on an upper side of the lower interlayer film, an upper interlayer film formed on an upper side of the intermediate film, and a lower plug made of an electrically conductive material that penetrates through the lower interlayer film and the intermediate film, wherein the upper interlayer film has an upper contact hole for electrical connection to the lower plug, and the intermediate film has such a material quality that a ratio of an etching rate of the intermediate film to an etching rate of the upper interlayer film is sufficiently small to allow processing of the upper contact hole by etching the upper interlayer film using the intermediate film as a stopper under an etching condition for forming the upper contact hole.

Adoption of the above-mentioned construction prevents the upper contact hole from being connected to the semiconductor substrate or the like located below to generate a short circuit owing to the intermediate film functioning as a stopper even if a region to become the bottom surface of the upper contact hole is deviated from the upper surface of the lower plug or goes out of the upper surface of the lower plug in forming the upper contact hole. Therefore, a semiconductor is provided in which the contact resistance is reduced by forming the upper contact hole to have a larger diameter without the need for enlarging the lower plug.

In the above-mentioned invention, the semiconductor device preferably includes a semiconductor element having a side wall on an upper side of the semiconductor substrate, and the intermediate film preferably has the same material quality as the side wall. Adoption of this construction enables use of the same source material and equipment in the step of forming the side wall and in the step of forming the intermediate film, whereby the semiconductor device can be produced with simpler production equipment.

In the above-mentioned invention, the upper interlayer film preferably has the same material quality as the lower interlayer film. Adoption of this construction enables use of the same source material and equipment in the step of forming the side wall and in the step of forming the intermediate film, whereby the semiconductor device can be produced with simpler production equipment.

In the above-mentioned invention, the lower plug preferably has a shape of being tapered towards a lower side, and a portion that penetrates through the intermediate film is preferably nearer to a parallel shape than a portion that penetrates through the lower interlayer film. Adoption of this construction prevents the upper surface of the lower plug from being enlarged even if the side wall of the lower plug has a moderate slope. Therefore, short circuits between the lower plugs are prevented.

In the above-mentioned invention, the intermediate film preferably has a material quality having a slower etching rate than the lower interlayer film under a wet etching condition for removing the lower interlayer film. Adoption of this construction can easily prevent the upper surface of the lower plug from being enlarged, because the hole formed in the intermediate film is not widened even if the bottom surface area of the lower plug is increased by isotropic etching so as to reduce the electric resistance value.

Further, in order to achieve the above-mentioned object, a method of producing a semiconductor device according to the present invention includes an intermediate film forming step for forming an intermediate film on an upper side of a lower interlayer film which is formed on an upper side of a semiconductor substrate, a plug hole forming step for forming a plug hole which is a hole for forming a lower plug so as to penetrate through the intermediate film and the lower interlayer film, a plug burying step for burying an electrical conductor in an inside of the plug hole to form the lower plug, an upper interlayer film forming step for forming an upper interlayer film on an upper side of the intermediate film and the lower plug so as to cover these, and an upper contact hole forming step for forming an upper contact hole that exposes at least a part of a surface of the lower plug without exposing the lower interlayer film by etching the upper interlayer film using the intermediate film as a stopper, wherein the intermediate film has such a material quality that a ratio of an etching rate of the intermediate film to an etching rate of the upper interlayer film is sufficiently small to allow processing of the upper contact hole by etching the upper interlayer film using the intermediate film as a stopper under an etching condition used in the upper contact hole forming step.

Adoption of the above-mentioned method prevents the upper contact hole from being connected to the semiconductor substrate or the like located below to generate a short circuit owing to the intermediate film functioning as a stopper even if a region to become the bottom surface of the upper contact hole is deviated from the upper surface of the lower plug or goes out of the upper surface of the lower plug in forming the upper contact hole. Therefore, a semiconductor can be produced in which the contact resistance is reduced by forming the upper contact hole to have a larger diameter without the need for enlarging the lower plug.

In the above-mentioned invention, a semiconductor element having a side wall is preferably formed on an upper side of the semiconductor substrate, and the intermediate film is preferably formed to have the same material quality as the side wall in the intermediate film forming step. Adoption of this method enables use of the same source material and equipment in the step of forming the side wall and in the step of forming the intermediate film, whereby the semiconductor device can be produced with simpler production equipment.

In the above-mentioned invention, the upper interlayer film is preferably formed to have the same material quality as the lower interlayer film in the upper interlayer film forming step. Adoption of this method enables use of the same source material and equipment in the step of forming the side wall and in the step of forming the intermediate film, whereby the semiconductor device can be produced with simpler production equipment.

In the above-mentioned invention, the plug hole is preferably formed to have a shape of being tapered towards a lower side in the plug hole forming step so that a portion that penetrates through the intermediate film is nearer to a parallel shape than a portion that penetrates through the lower interlayer film. Adoption of this method prevents the upper surface of the lower plug from being enlarged even if the side wall of the lower plug has a moderate slope. Therefore, short circuits between the lower plugs are prevented.

In the above-mentioned invention, the intermediate film is preferably formed in the intermediate film forming step to have a material quality having a slower etching rate than the lower interlayer film under an etching condition for forming the plug hole in the lower interlayer film. Adoption of this method can easily prevent the upper surface of the lower plug from being enlarged, because the hole formed in the intermediate film is not widened even if the bottom surface area of the lower plug is increased by isotropic etching so as to reduce the electric resistance value.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

Referring to FIGS. 1 to 5, a method of producing a semiconductor device according to the first embodiment of the present invention will be described.

Figure 1:
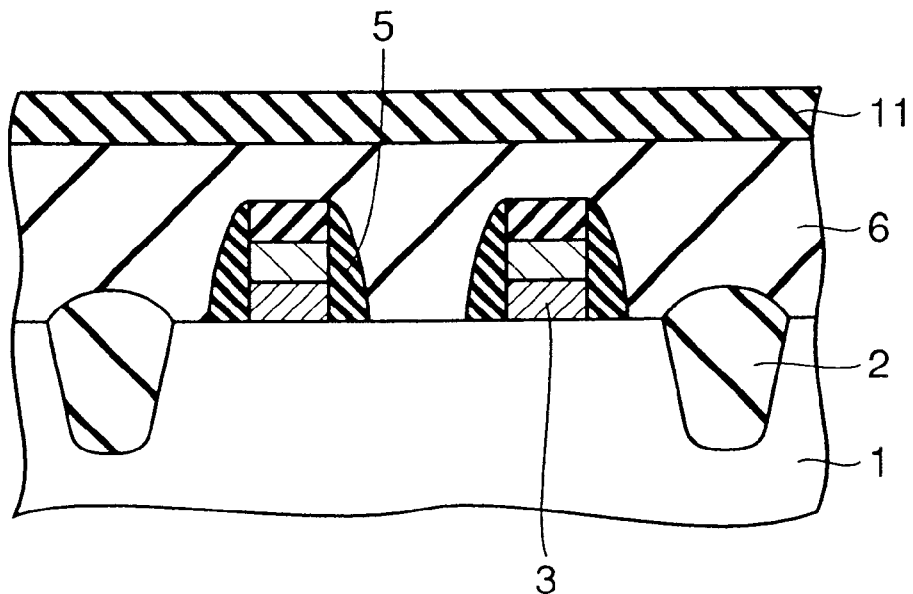
FIG. 1 is a cross section view in the eleventh step of a production method of a semiconductor device according to the first embodiment of the present invention.

The steps shown in FIGS. 10 to 15 are the same as those described above in the method of producing a semiconductor device according to a prior art technique. In the state shown in FIG. 15, an intermediate film 11 is formed on an upper side thereof, as shown in FIG. 1. As the material quality of the intermediate film 11, SiON, densely formed $SiO_2$, and others may be mentioned as examples in the same manner as the stopper film 4 (See FIG. 13). Dense $SiO_2$ can be formed, for example, by CVD (Chemical Vapor Deposition) method. It is preferable that the material quality of the intermediate film 11 is the same as the material quality of the stopper film 4 with which the side wall 5 is to be formed later, because then the same source material and equipment can be used; however, the intermediate film 11 may have a different material quality from the stopper film 4.

Figure 2:
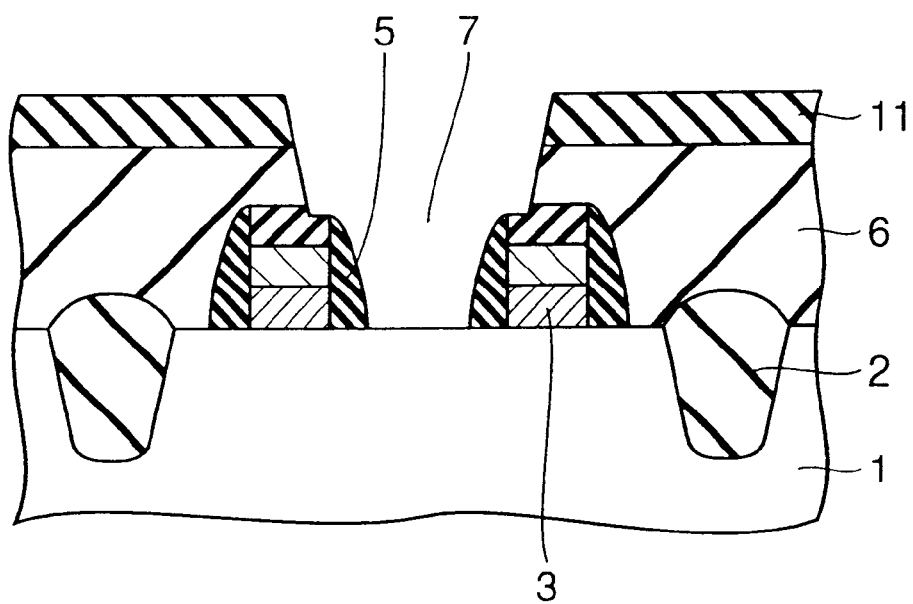
FIG. 2 is a cross section view in the twelfth step of the production method of the semiconductor device according to the first embodiment of the present invention.

Referring to FIG. 2, a lower contact hole 7 is formed by etching to penetrate through the intermediate film 11 and the lower interlayer film 6. In performing this etching step, the etching condition is changed between the removal of the intermediate film 11 and the removal of the lower interlayer film 6. In the former, since only the intermediate film 11 is to be removed, the etching condition is set in such a manner that the selection ratio of the intermediate film 11 to a mask (not illustrated) will be sufficiently large. In the latter, the etching condition is set in such a manner that the selection ratio of the lower interlayer film 6 to the intermediate film 11 will be sufficiently large. Thus, the semiconductor substrate 1 is exposed on the bottom surface of the lower contact hole 7. The side surface of the transistor 3 is protected by the side wall 5.

Figure 3:
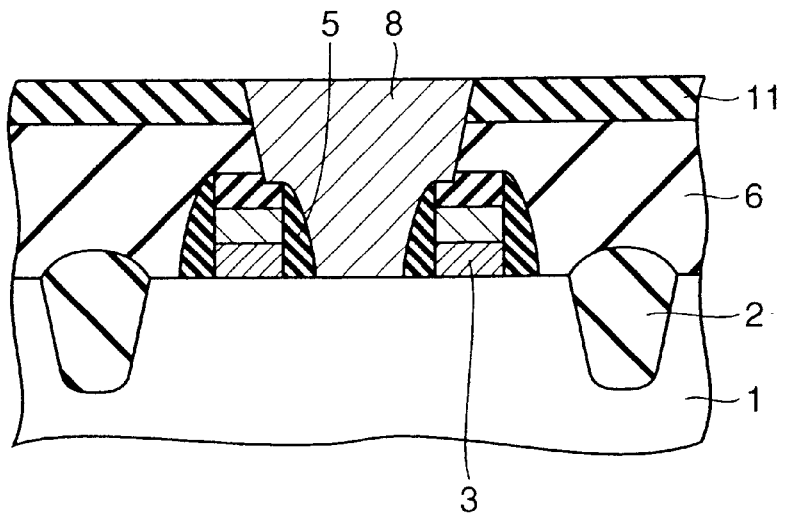
FIG. 3 is a cross section view in the thirteenth step of the production method of the semiconductor device according to the first embodiment of the present invention.
Figure 4:
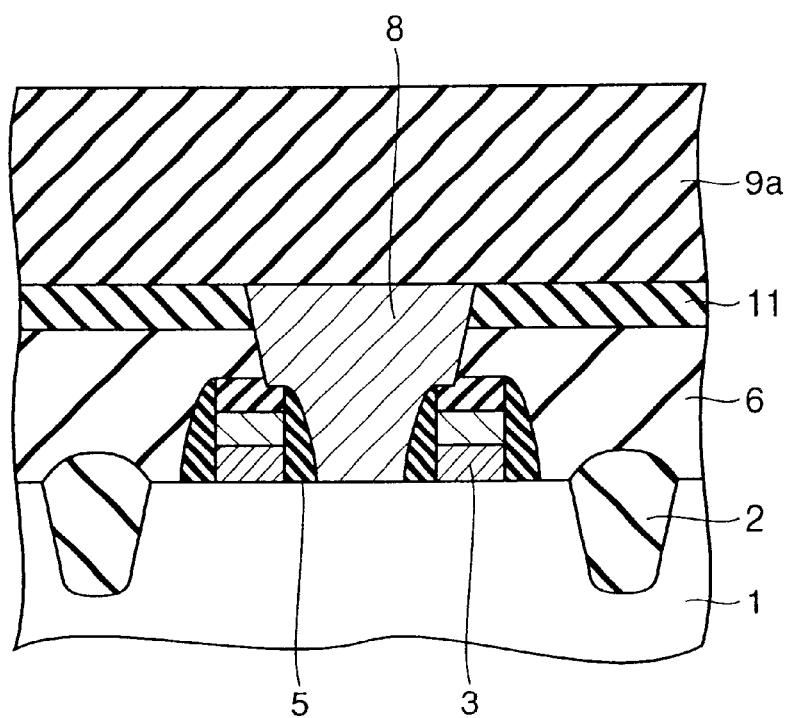
FIG. 4 is a cross section view in the fourteenth step of the production method of the semiconductor device according to the first embodiment of the present invention.

After a polycrystal silicon layer is formed on the entire surface from the upper side by thermal CVD or the like, unnecessary portions of the polycrystal silicon are removed by CMP or the like so that the polycrystal silicon will remain only in the inside of the lower contact hole 7. Thus, a structure is obtained in which the inside of the lower contact hole 7 is filled with the electrically conductive polycrystal silicon, as shown in FIG. 3, and this polycrystal silicon part forms the lower plug 8. Referring to FIG. 4, an upper interlayer film 9a is formed on the upper side so as to cover the lower interlayer film 6 and the lower plug 8. As the material quality of the upper interlayer film 9a, an insulating film, in particular, $SiO_2$, BPTEOS, P-TEOS, SiON, and others, may be mentioned as examples. However, a combination of the material qualities of the intermediate film 11 and the upper interlayer film 9a is set such that the selection ratio of the upper interlayer film 9a to the intermediate film 11 is sufficiently large under an etching condition for removing the upper interlayer film 9a. For this purpose, phosphorus-containing $SiO_2$, coarsely formed $SiO_2$, and others are preferable in the same manner as the lower interlayer film 6. The upper interlayer film 9a may be different from the lower interlayer film 6; however, if they have the same material quality, it is preferable because the same source material and equipment can be used.

Figure 5:
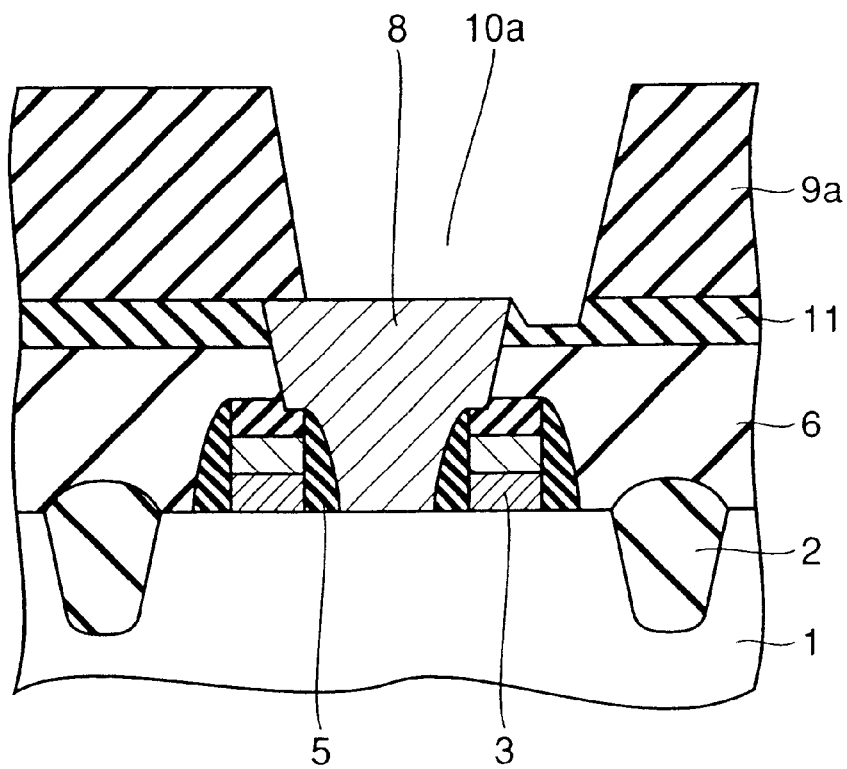
FIG. 5 is a cross section view in the fifteenth step of the production method of the semiconductor device according to the first embodiment of the present invention.

Referring to FIG. 5, an upper contact hole 10a is formed by etching the upper interlayer film 9a.

In the above description of the production method, only the steps up to the formation of the upper contact hole 10a have been described; however, the semiconductor device according to this embodiment may be any one having a construction shown in FIG. 5. If a semiconductor has this construction, electrical connection can be easily established from another upper layer (not illustrated) if only an electrical conductor is disposed in the inside of the upper contact hole 10a successively using a known technique.

Even if a region to become the bottom surface of the upper contact hole 10a is deviated from the position of the lower plug 8 or goes out of the upper surface region of the lower plug 8 in dropping the upper contact hole 10a from the state shown in FIG. 4, owing to the presence of the intermediate film 11 and also since the selection ratio of the upper interlayer film 9a to the intermediate film 11 is large, the intermediate film 11 functions as a stopper to stop the etching within the intermediate film 11 as shown in FIG. 5. Therefore, the upper contact hole 10a is prevented from reaching the semiconductor substrate 1 or the like located below as it is. Therefore, the upper contact hole 10a can be formed to have a larger diameter than the conventional upper contact hole 10.

Figure 9:
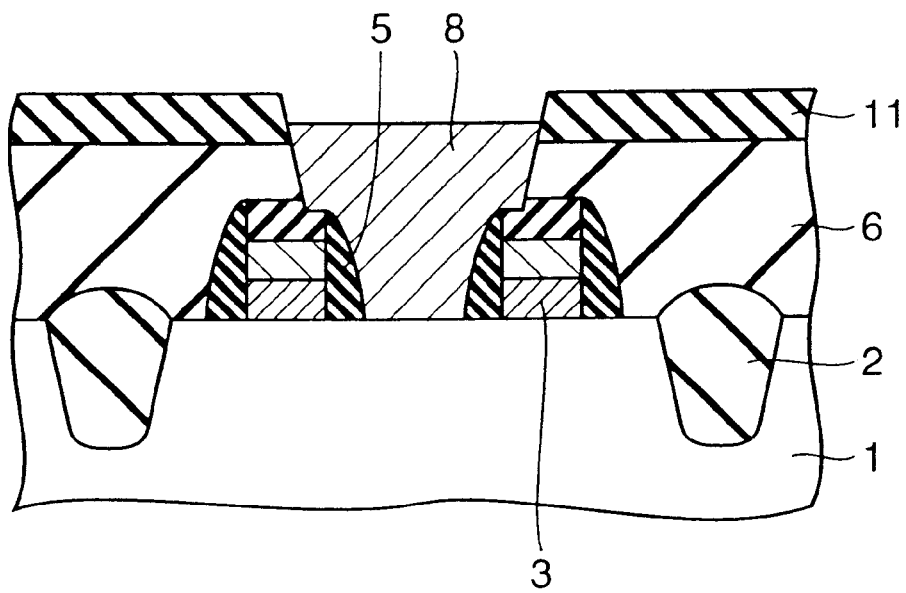
FIG. 9 is a cross section view for explanation according to the first embodiment of the present invention.
Figure 10:
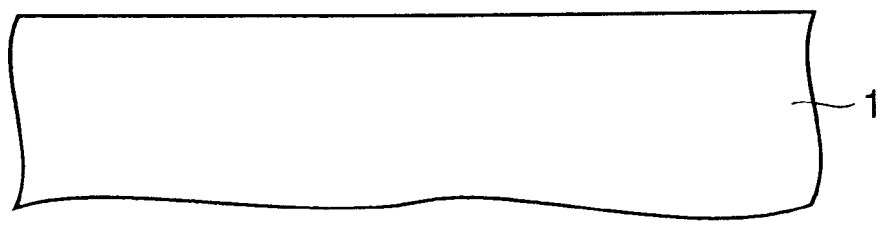
FIG. 10 is a cross section view in the first step of a production method of a semiconductor device according to a prior art technique.
Figure 11:
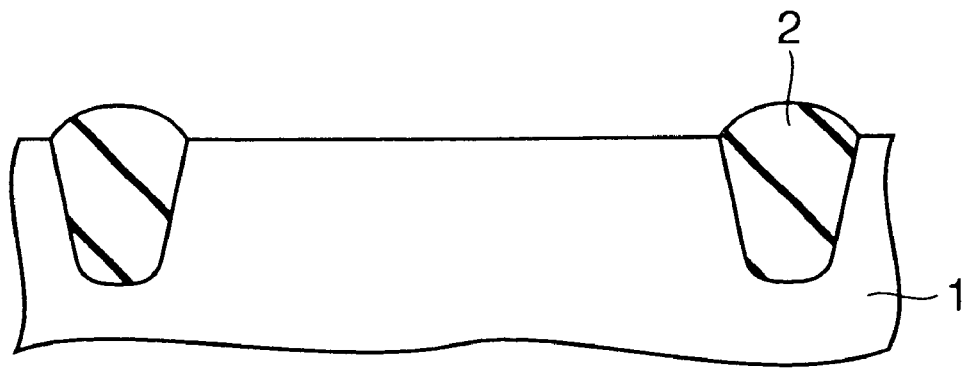
FIG. 11 is a cross section view in the second step of the production method of the semiconductor device according to the prior art technique.
Figure 12:
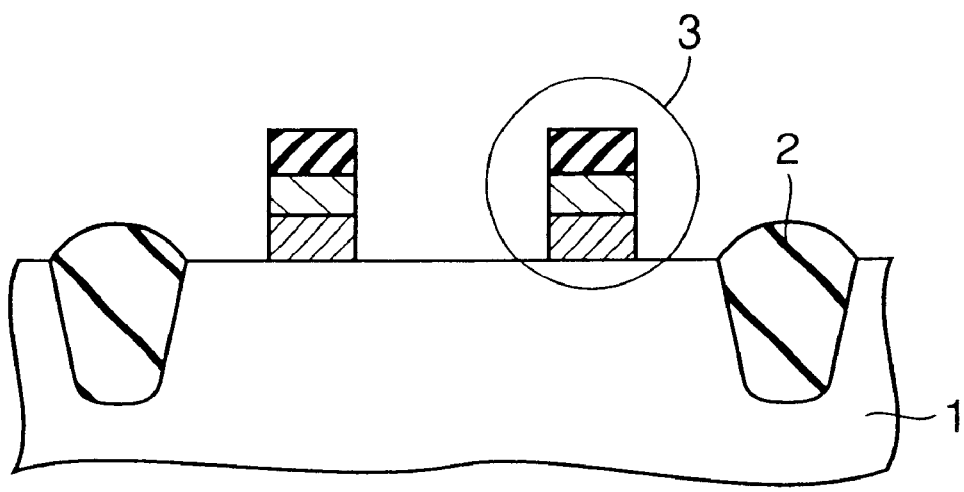
FIG. 12 is a cross section view in the third step of the production method of the semiconductor device according to the prior art technique.
Figure 13:
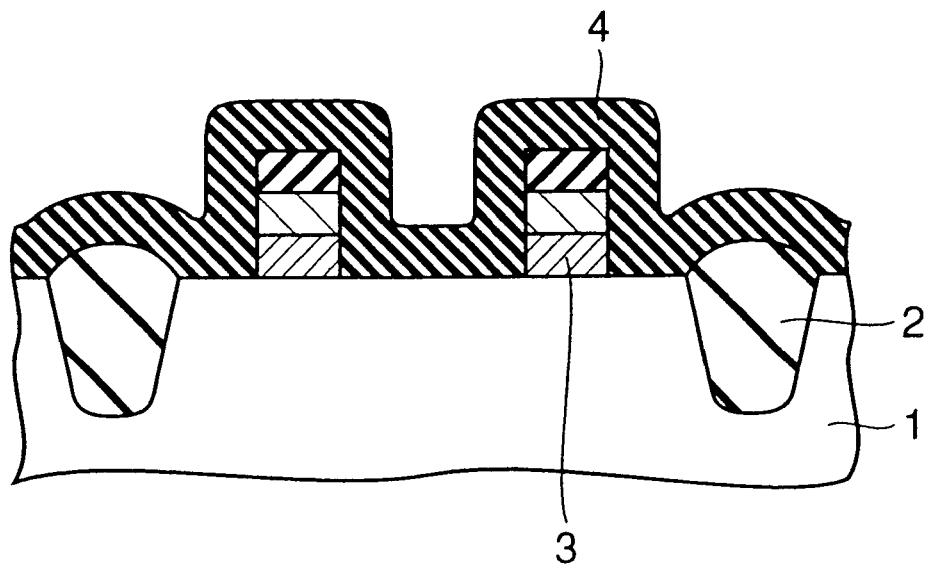
FIG. 13 is a cross section view in the fourth step of the production method of the semiconductor device according to the prior art technique.
Figure 14:
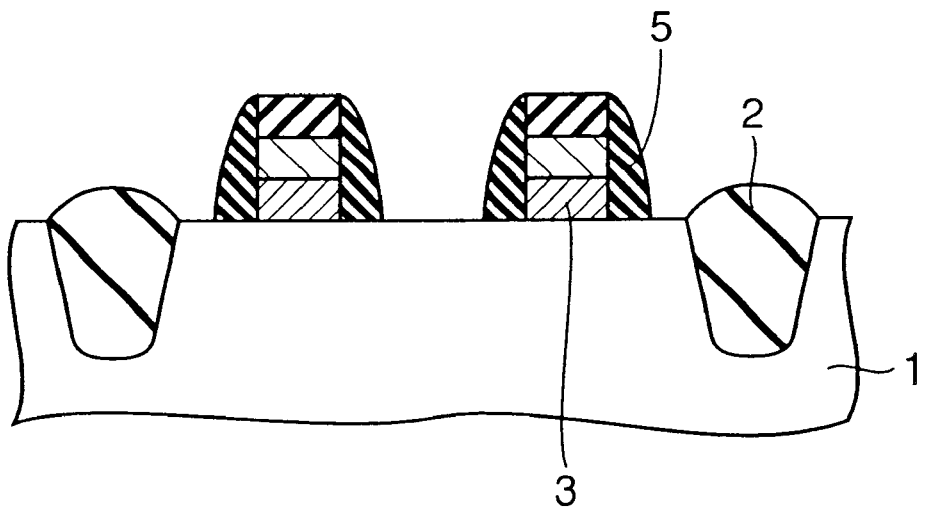
FIG. 14 is a cross section view in the fifth step of the production method of the semiconductor device according to the prior art technique.
Figure 15:
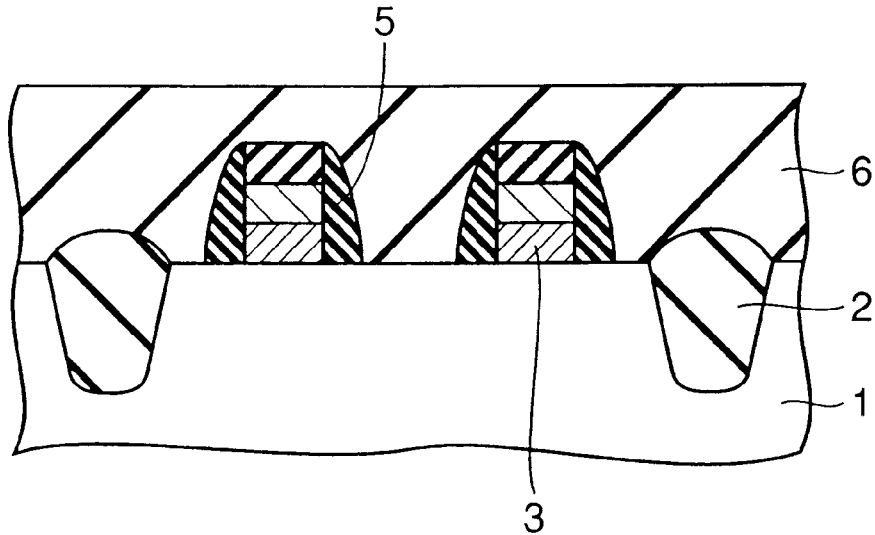
FIG. 15 is a cross section view in the sixth step of the production method of the semiconductor device according to the prior art technique.
Figure 16:
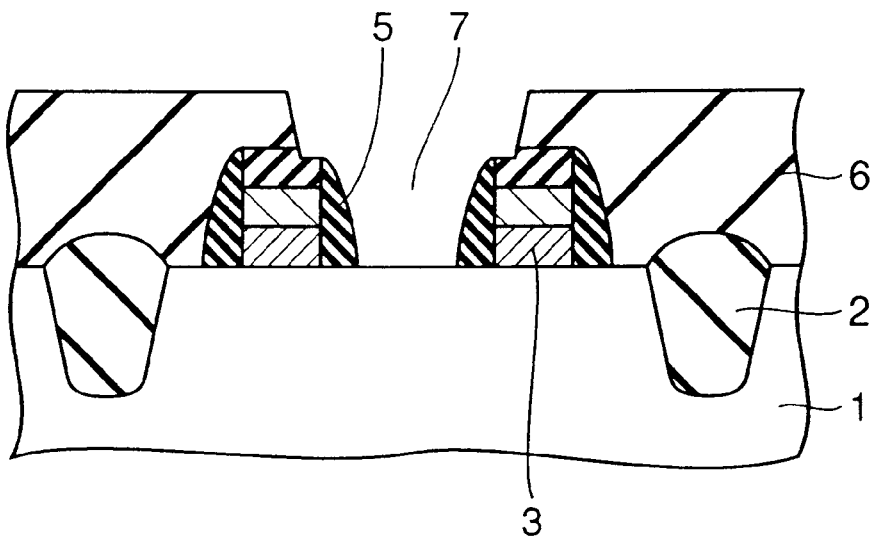
FIG. 16 is a cross section view in the seventh step of the production method of the semiconductor device according to the prior art technique.
Figure 17:
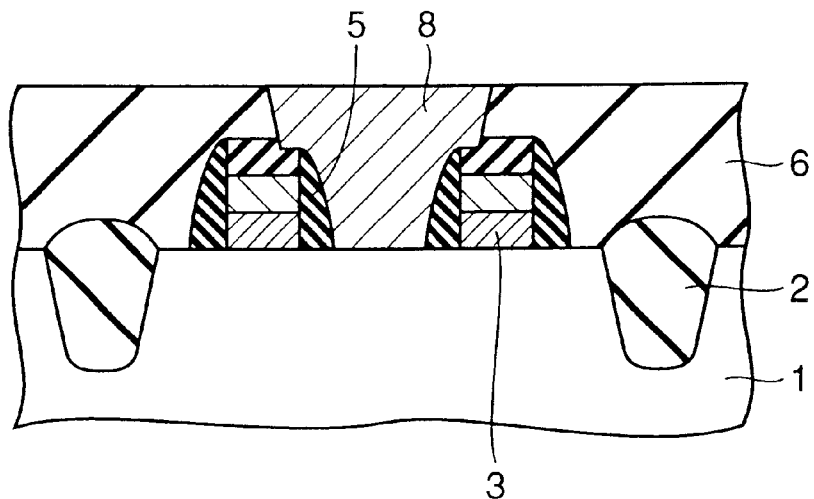
FIG. 17 is a cross section view in the eighth step of the production method of the semiconductor device according to the prior art technique.
Figure 18:
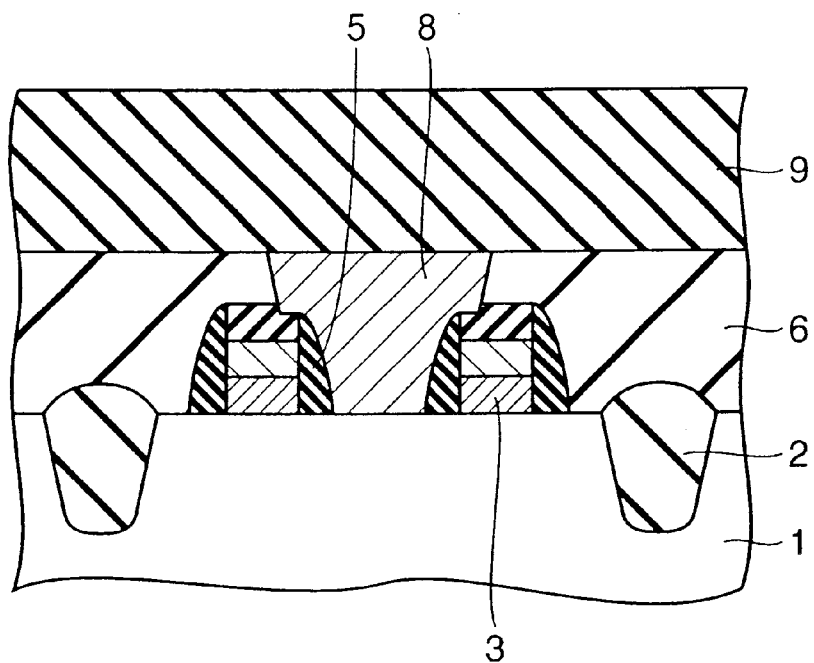
FIG. 18 is a cross section view in the ninth step of the production method of the semiconductor device according to the prior art technique.
Figure 19:
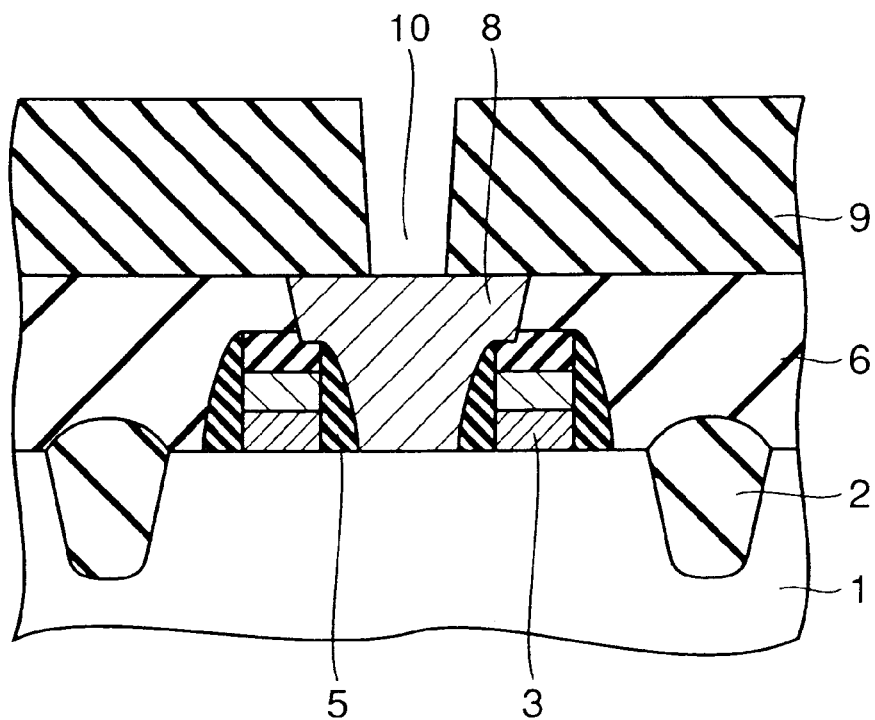
FIG. 19 is a cross section view in the tenth step of the production method of the semiconductor device according to the prior art technique.

Here, the lower plug 8 is not limited to the case in which the upper surface of the lower plug 8 is at the same height (level) as the upper surface of the intermediate film 11 as shown in FIG. 3, and may have a different height to some extent, as shown in FIG. 9, as long as the upper surface of the lower plug 8 is at a level above the lower surface of the intermediate film 11. This is because the intermediate film 11 can function as a stopper in etching the upper interlayer film 9a as long as the upper surface of the lower plug 8 is at a level above the lower surface of the intermediate film 11.

(Second Embodiment)

Generally, the lower contact hole 7 is formed to have an approximately tapered shape with a narrow bottom and a wide top. Therefore, if the length of the lower plug 8 in the up-and-down direction is large, a large upper surface of the lower plug 8 means a large possibility of short circuit generation by contact of adjacent lower plugs 8 with each other. Thus, as the second embodiment of the present invention, a technique for avoiding such a short circuit will be described.

Figure 6:
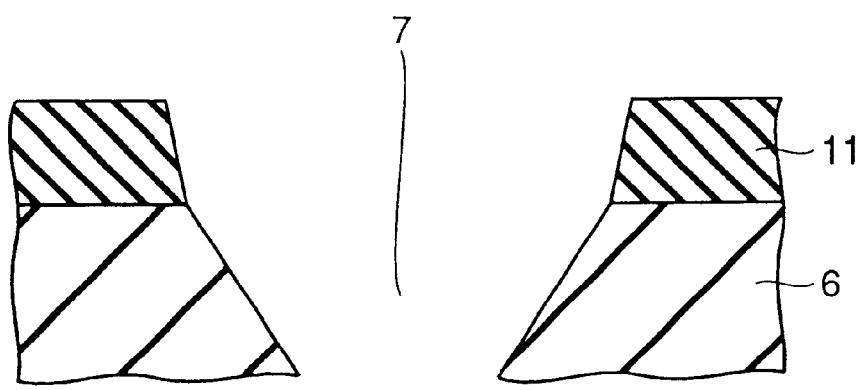
FIG. 6 is an enlarged cross section view of an essential part of a semiconductor device according to the second embodiment of the present invention.

By changing the etching condition of the lower contact hole 7 shown in FIG. 2, the intermediate film 11 portion of the lower contact hole 7 can have a differently sloped side wall from the lower interlayer film 6 portion of the lower contact hole 7, as shown in FIG. 6 as the enlarged view of the essential portion. For example, if an etching condition for removing the intermediate film 11 is set such that the removing capability along a desired direction is high, the side wall will be near to a parallel shape, i.e. the slope will be sharp (See FIG. 6). Further, if an etching condition for removing the lower interlayer film 6 is set such that the lower interlayer film 6 is etched while forming a protective film on the side wall, the slope of the side wall will be away from a parallel shape, i.e. the slope will be moderate (See FIG. 6).

By providing such a slope difference, the upper surface of the lower plug 8 can be prevented from increasing even if the slope of the side wall of the lower plug 8 is moderate.

Therefore, the short circuit of the lower plugs 8 with each other can be prevented if the upper surface of the lower plug 8 can be prevented from increasing by providing a difference in the slope of the side wall of the lower contact hole 7 as described above.

(Third Embodiment)

As the third embodiment of the present invention, a technique intended for preventing short circuits in the same manner as the second embodiment will be described.

Figure 7:
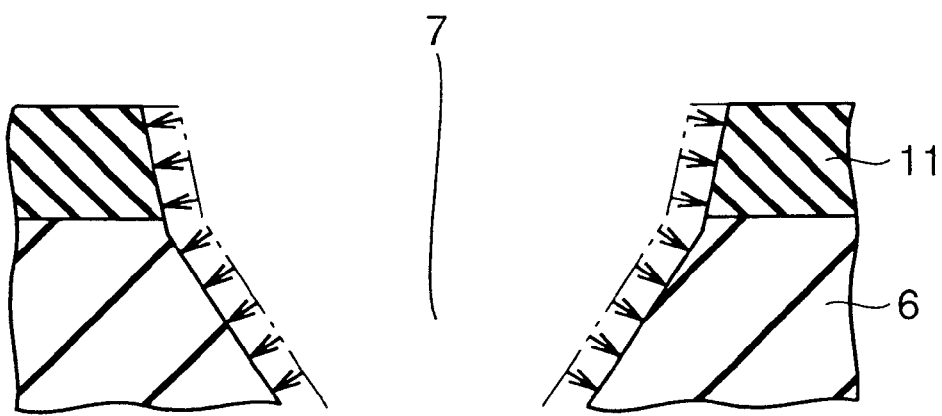
FIG. 7 is an enlarged cross section view of an essential part for explanation according to the third embodiment of the present invention.

In the state shown in FIG. 6 of the second embodiment, the bottom surface area where the semiconductor substrate 1 (not illustrated in FIG. 6) is exposed is small because the slope of the side wall in the lower interlayer film 6 is moderate. Therefore, in order to increase the bottom surface area for reducing the contact resistance, a technique is known to perform a wet etching process, which is an isotropic etching process. By wet etching, the lower contact hole 7 is enlarged in the front-and-rear direction of the document sheet in FIG. 6, whereby the bottom surface area is enlarged. However, in this case, if the etching rates of the intermediate film 11 and the lower interlayer film 6 are not so different, the lower contact hole 7 is enlarged simultaneously in the right-and-left direction in FIG. 6, so that the width of the upper surface of the lower plug 8 will increase as shown in FIG. 7, thereby raising a problem of short circuits between the lower plugs 8 as described in the second embodiment.

Therefore, in the third embodiment of the present invention, the material qualities are set in such a manner that the selection ratio of the lower interlayer film 6 to the intermediate film 11 will be sufficiently large under this wet etching condition.

Figure 8:
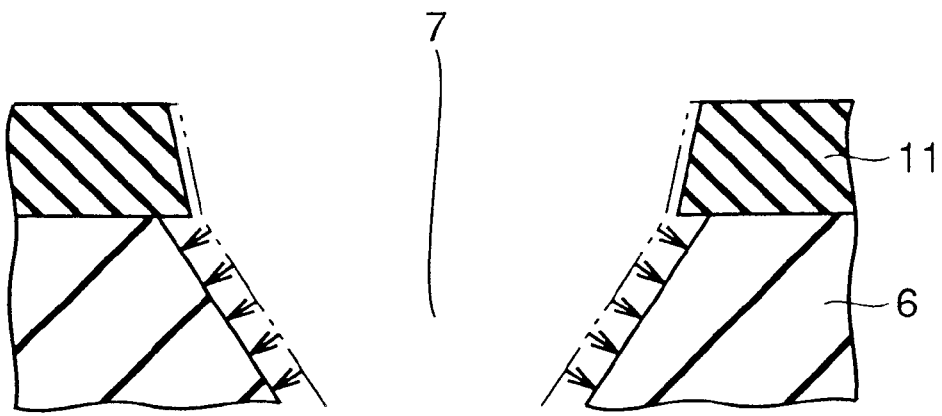
FIG. 8 is an enlarged cross section view of an essential part of a semiconductor device according to the third embodiment of the present invention.

By doing so, the lower interlayer film 6 will be removed in a large amount while the intermediate film 11 is hardly removed even by wet etching. In other words, a shape shown in FIG. 8 is formed. Therefore, the contact resistance can be reduced by increasing the bottom surface area where the semiconductor substrate 1 is exposed, and also the short circuits can be prevented by restraining the enlargement of the upper surface of the lower plug 8.

The present invention prevents the upper contact hole from being connected to the semiconductor substrate or the like located below to generate a short circuit owing to the intermediate film functioning as a stopper even if a region to become the bottom surface of the upper contact hole is deviated from the upper surface of the lower plug or goes out of the upper surface of the lower plug in forming the upper contact hole.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor substrate;
   a lower interlayer film formed on an upper side of said semiconductor substrate;
   an intermediate film formed on an upper side of said lower interlayer film;
   an upper interlayer film formed on an upper side of said intermediate film; and
   a lower plug made of an electrically conductive material that penetrates through said lower interlayer film and said intermediate film, wherein
   said upper interlayer film has an upper contact hole for electrical connection to said lower plug, and
   said intermediate film has such a material quality that a ratio of an etching rate of said intermediate film to an etching rate of said upper interlayer film is sufficiently small to allow processing of said upper contact hole by etching said upper interlayer film using said intermediate film as a stopper under an etching condition for forming said upper contact hole.

2. A semiconductor device according to claim 1, including a semiconductor element having a side wall on an upper side of said semiconductor substrate, wherein said intermediate film has the same material quality as said side wall.

3. A semiconductor device according to claim 1, wherein said upper interlayer film has the same material quality as said lower interlayer film.

4. A semiconductor device according to claim 1, wherein said lower plug has a shape of being tapered towards a lower side, and a portion that penetrates through said intermediate film is nearer to a parallel shape than a portion that penetrates through said lower interlayer film.

5. A semiconductor device according to claim 4, wherein said intermediate film has a material quality having a slower etching rate than said lower interlayer film under a wet etching condition for removing said lower interlayer film.

6. A method of producing a semiconductor device, comprising:
   an intermediate film forming step for forming an intermediate film on an upper side of a lower interlayer film which is formed on an upper side of a semiconductor substrate;
   a plug hole forming step for forming a plug hole which is a hole for forming a lower plug so as to penetrate through said intermediate film and said lower interlayer film;

a plug burying step for burying an electrical conductor in an inside of said plug hole to form said lower plug;

an upper interlayer film forming step for forming an upper interlayer film on an upper side of said intermediate film and said lower plug so as to cover these; and an upper contact hole forming step for forming an upper contact hole that exposes at least a part of a surface of said lower plug without exposing said lower interlayer film by etching said upper interlayer film using said intermediate film as a stopper, wherein said intermediate film has such a material quality that a ratio of an etching rate of said intermediate film to an etching rate of said upper interlayer film is sufficiently small to allow processing of said upper contact hole by etching said upper interlayer film using said intermediate film as a stopper under an etching condition used in said upper contact hole forming step.

7. A method of producing a semiconductor device according to claim 6, wherein a semiconductor element having a side wall is formed on an upper side of said semiconductor substrate, and wherein said intermediate film is formed to have the same material quality as said side wall in said intermediate film forming step.

8. A method of producing a semiconductor device according to claim 6, wherein said upper interlayer film is formed to have the same material quality as said lower interlayer film in said upper interlayer film forming step.

9. A method of producing a semiconductor device according to claim 6, wherein said plug hole is formed to have a shape of being tapered towards a lower side in said plug hole forming step so that a portion that penetrates through said intermediate film is nearer to a parallel shape than a portion that penetrates through said lower interlayer film.

10. A method of producing a semiconductor device according to claim 9, wherein said intermediate film is formed in said intermediate film forming step to have a material quality having a slower etching rate than said lower interlayer film under an etching condition for forming said plug hole in said lower interlayer film.

* * * * *